(12) United States Patent
Takeda et al.

(10) Patent No.: US 9,075,306 B2
(45) Date of Patent: *Jul. 7, 2015

(54) CHEMICALLY AMPLIFIED NEGATIVE RESIST COMPOSITION AND PATTERNING PROCESS

(75) Inventors: Takanobu Takeda, Joetsu (JP); Tamotsu Watanabe, Joetsu (JP); Ryuji Koitabashi, Joetsu (JP); Keiichi Masunaga, Joetsu (JP); Akinobu Tanaka, Joetsu (JP); Osamu Watanabe, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/074,680

(22) Filed: Mar. 29, 2011

(65) Prior Publication Data

US 2011/0177464 A1    Jul. 21, 2011

Related U.S. Application Data

(63) Continuation of application No. 12/058,967, filed on Mar. 31, 2008, now abandoned.

(30) Foreign Application Priority Data

Mar. 29, 2007    (JP) .................................. 2007-087243

(51) Int. Cl.
*G03F 7/038* (2006.01)
*G03F 7/20* (2006.01)

(52) U.S. Cl.
CPC .............. *G03F 7/0382* (2013.01); *G03F 7/20* (2013.01)

(58) Field of Classification Search
CPC .......... G03F 7/004; G03F 7/0382; G03F 7/20
USPC ................... 430/270.1, 277.1, 325, 330, 927
See application file for complete search history.

(56) References Cited

U.S. PATENT DOCUMENTS

| | | | |
|---|---|---|---|
| 6,746,817 B2 | 6/2004 | Takeda et al. | |
| 6,902,862 B2 * | 6/2005 | Takahashi et al. | 430/270.1 |
| 2004/0023151 A1 | 2/2004 | Takeda et al. | |
| 2004/0260031 A1 | 12/2004 | Takeda et al. | |
| 2006/0166133 A1 | 7/2006 | Koitabashi et al. | |
| 2007/0111139 A1 * | 5/2007 | Takeda et al. | 430/270.1 |
| 2008/0045621 A1 | 2/2008 | Ito et al. | |
| 2010/0291484 A1 * | 11/2010 | Tanaka et al. | 430/285.1 |

FOREIGN PATENT DOCUMENTS

| | | | |
|---|---|---|---|
| EP | 0 907 105 | * | 4/1999 |
| EP | 1684118 A1 | | 7/2006 |
| EP | 1791025 A2 | | 5/2007 |
| JP | 2004-101811 A | | 4/2004 |
| JP | 2005-62800 A | | 3/2005 |
| JP | 2006-201532 A | | 8/2006 |
| JP | 2006-215180 A | | 8/2006 |
| JP | 2008-77057 A | | 4/2008 |

OTHER PUBLICATIONS

Machine translation of JP 2006-215180, published on Aug. 17, 2006.*
Japanese Office Action dated Sep. 2, 2009, issued in corresponding Japanese Patent Application No. 2007-087243.
European Search Report dated Aug. 22, 2008, issued in corresponding European Patent Application No. 08005856.3.
March, Jerry, "Advanced Organic Chemistry", Localized Chemical Bonding, Wiley-Interscience, p. 18, table 1.3, 1992, XP-002490563.
Office Action issued Sep. 8, 2010 in parent U.S. Appl. No. 12/058,967.
Office Action issued Dec. 29, 2010 in parent U.S. Appl. No. 12/058,967.

* cited by examiner

*Primary Examiner* — Anca Eoff
(74) *Attorney, Agent, or Firm* — Westerman, Hattori, Daniels & Adrian, LLP (57) ABSTRACT

A chemically amplified negative resist composition comprises a polymer comprising recurring hydroxystyrene units and recurring styrene units having electron withdrawing groups substituted thereon. In forming a pattern having a fine feature size of less than 0.1 μm, the composition exhibits a high resolution in that a resist coating formed from the composition can be processed into such a fine size pattern while the formation of bridges between pattern features is minimized.

8 Claims, 1 Drawing Sheet

CHEMICALLY AMPLIFIED NEGATIVE RESIST COMPOSITION AND PATTERNING PROCESS

CROSS-REFERENCE TO RELATED APPLICATION

This application is a continuation of U.S. application Ser. No. 12/058,967 filed on Mar. 31, 2008. The priority application, 2007-087243 filed in Japan on Mar. 29, 2007, upon which U.S. application Ser. No. 12/058,967 is based, is hereby incorporated by reference.

TECHNICAL FIELD

This invention relates to a chemically amplified negative resist composition and more particularly, to a chemically amplified negative resist composition comprising a polymer having aromatic rings for use in processing of semiconductor and photomask substrates, and a patterning process using the same.

BACKGROUND ART

To meet the recent demand for higher integration in integrated circuits, pattern formation to a finer feature size is required. In forming resist patterns with a feature size of 0.2 μm or less, chemically amplified resist compositions utilizing photo-generated acid as the catalyst are typically used in the art because of their high sensitivity and resolution. Often, high-energy radiation such as UV, deep UV or electron beam (EB) is used as the light source for exposure of these resist compositions. Among others, the EB or EUV lithography is recognized most attractive because patterns of the finest size are expectable.

Resist compositions include positive ones in which exposed areas become soluble and negative ones in which exposed areas are left as a pattern. A suitable composition is selected among them depending on the desired resist pattern. In general, the chemically amplified negative resist composition comprises a polymer which is normally soluble in an aqueous alkaline developer, an acid generator which is decomposed to generate an acid when exposed to light, and a crosslinker which causes the polymer to crosslink in the presence of the acid serving as a catalyst, thus rendering the polymer insoluble in the developer (sometimes, the crosslinker is incorporated in the polymer). Typically a basic compound is added for controlling the diffusion of the acid generated upon light exposure.

A number of negative resist compositions of the type comprising a polymer which is soluble in an aqueous alkaline developer and includes phenolic units as the alkali-soluble units were developed, especially as adapted for exposure to KrF excimer laser light. These compositions have not been used in the ArF excimer laser lithography because the phenolic units are not transmissive to exposure light having a wavelength of 150 to 220 nm. Recently, these compositions are recognized attractive again as the negative resist composition for the EB and EUV lithography capable of forming finer size patterns. Exemplary compositions are described in JP-A 2006-201532 (corresponding to US 20060166133, EP 1684118, CN 1825206) and JP-A 2006-215180.

As the required pattern size is reduced, more improvements are made on the negative resist composition of the type using hydroxystyrene units typical of the phenolic units. Now that the pattern reaches a very fine size of 0.1 or less, there is a likelihood that the resist layer is left like thin strings between features of a fine size pattern, which is known as "bridge problem." The prior art compositions fail to solve the problem.

Also known in the art is the problem of pattern's substrate dependence, that is, the profile of a pattern alters near a processable substrate, depending on the material of which the substrate is made. As the desired pattern size is reduced, even a minor profile alteration becomes significant. Particularly in processing a photomask blank having the outermost surface made of chromium oxynitride, if a pattern is formed on the chromium oxynitride using a chemically amplified negative resist composition, then an "undercut" problem arises, that is, the pattern is notched at positions in contact with the substrate. The prior art compositions fail to fully solve the undercut problem.

DISCLOSURE OF THE INVENTION

An object of the present invention is to provide a chemically amplified negative resist composition which can form a pattern having few bridges without substantial substrate dependence, and a patterning process using the same.

Assuming that the cause of bridging is a low contrast of crosslinking reaction, the inventors attempted to improve the contrast by introducing a greater number of electron donative groups into constituent units of a polymer for increasing the number of active sites in the polymer which are reactive with a crosslinker.

In JP-A 2006-201532, cited above, the polymer used contains hydroxystyrene units and carbonyloxystyrene units as styrene derivative units. When styrene units having substituted thereon alkoxy groups, which are electron donative groups, were used instead of the carbonyloxystyrene units, then the number of active sites in the polymer which are reactive with a crosslinker could be increased without significantly altering the alkali dissolution rate of the polymer. To verify the effect of electron donative groups, on the other hand, a polymer comprising styrene units having electron withdrawing groups was prepared as a control. A comparison was made in resist performance between these polymers. Quite unexpectedly, we have found that the resist using the polymer comprising styrene units having electron withdrawing groups substituted thereon is unlikely to leave bridges, as compared with the prior art polymers and polymers having electron donative groups substituted thereon, and is minimized in pattern's substrate dependence.

In one aspect, the invention provides a chemically amplified negative resist composition comprising as a base resin a polymer comprising recurring units having the general formulae (1) and (2):

(2)

wherein $R^1$ and $R^2$ are each independently hydrogen or methyl, X is an electron withdrawing group, m is 0 or an integer of 1 to 4, and n is an integer of 1 to 5, the polymer having a weight average molecular weight of 1,000 to 50,000. The resist composition is used to form a resist coating which has a high resolution and gives rise to little bridge problem when patterned.

The electron withdrawing group represented by X has an active structure directly bonded to the benzene ring, examples of which include a halogen atom due to the inductive effect, and a carbonyl group, nitro group, cyano group, sulfinyl group, and sulfonyl group due to the mesomeric effect.

The most preferred examples of the electron withdrawing group include chlorine, bromine and iodine. When these elements are incorporated into a polymer, the undercut problem of resist pattern near substrate and the bridge problem between fine pattern features are significantly mitigated.

In one preferred embodiment of the resist composition, the polymer may further comprise recurring units having the general formula (3):

(3)

wherein $R^3$ and $R^4$ are each independently hydrogen, optionally substituted hydroxyl, or halogen, and u is 0 or an integer of 1 to 5. Inclusion of these units provides high etch resistance, enabling to reduce the thickness of resist coating.

Preferably the polymer has a weight average molecular weight (Mw) of 2,000 to 8,000. With too low a Mw, the resulting pattern may be prone to thermal deformation. With too high a Mw, a bridge problem is likely to occur during development, depending on a particular composition.

In a preferred embodiment, the polymer is obtained by removing a low molecular weight fraction from a polymer product as polymerized, so that the polymer has a dispersity Mw/Mn equal to or less than 1.7. Note that the dispersity is a weight average molecular weight divided by a number average molecular weight, Mw/Mn, and represents a molecular weight distribution. By removing the low molecular weight fraction so as to achieve a dispersity of 1.7 or less, the profile of a resist pattern is improved, and especially the undercut problem associated with substrate dependence is ameliorated.

In another aspect, the invention provides a pattern forming process comprising the steps of applying the resist composition defined above onto a substrate to form a coating, heating the coating prior to exposure, exposing the coating to light, soft x-ray or electron beam, post-exposure heating the coating, and developing the coating with an aqueous alkaline solution.

In a further aspect, the invention provides a resist pattern forming process comprising the steps of providing a substrate having a surface composed mainly of a transition metal compound, providing a chemically amplified negative resist composition comprising a polymer comprising recurring units having the general formulae (1) and (2) and having a weight average molecular weight of 1,000 to 50,000, and forming a resist pattern on the substrate using the chemically amplified negative resist composition. Typical of the material of which a photomask blank surface is made is a material containing a transition metal and oxygen and/or nitrogen. When a resist pattern is formed on the surface of transition metal compound substrate, there is a likelihood that the pattern profile becomes defective near the substrate surface. The resist composition of this embodiment ensures to form a pattern of a good profile even when applied to the transition metal compound surface.

The electron withdrawing group represented by X has an active structure directly bonded to the benzene ring, examples of which include a halogen atom, carbonyl group, nitro group, cyano group, sulfinyl group, and sulfonyl group.

In a preferred embodiment of the process, the polymer may further comprise recurring units having the general formula (3). Inclusion of the units of formula (3) enables to form a thinner resist coating even when the transition metal compound, which is difficult to establish a selectivity ratio during etching, is to be etched through the resist.

The transition metal compound may comprise at least one transition metal selected from chromium, molybdenum, zirconium, tantalum, tungsten, titanium, and niobium, and optionally, at least one element selected from oxygen, nitrogen and carbon. These compounds are generally used as a material to form a surface layer of a photomask blank and specifically serve as an etch mask, light-shielding film, antireflective coating or the like.

BENEFITS OF THE INVENTION

The chemically amplified negative resist composition comprising a polymer comprising recurring hydroxystyrene units and recurring styrene units having electron withdrawing groups substituted thereon has many advantages. When it is desired to form a pattern having a fine feature size of less than 0.1 µm, the composition exhibits a high resolution in that a resist coating formed from the composition can be processed into such a fine size pattern while the formation of bridges between pattern features is minimized.

In the processing of a photomask substrate wherein a substrate surface is of a transition metal compound, an undercut problem often arises in a resist pattern formed on the surface. The use of the negative resist composition of the invention ensures to define a resist pattern of good profile even on the transition metal compound because the dependence of the pattern on the substrate is minimized.

DESCRIPTION OF THE PREFERRED EMBODIMENT

The polymer or high molecular weight compound used in the chemically amplified negative resist composition of the invention comprises recurring units having the general formulae (1) and (2) and has a weight average molecular weight of 1,000 to 50,000.

(1)

(2)

Herein $R^1$ and $R^2$ are each independently a hydrogen atom or methyl group, X is an electron withdrawing group, m is 0 or an integer of 1 to 4, and n is an integer of 1 to 5.

The polymer may further comprise recurring units having the general formula (3).

(3)

Herein $R^3$ and $R^4$ are each independently a hydrogen atom, optionally substituted hydroxyl group, or halogen atom, and u is 0 or an integer of 1 to 5.

Although the polymers used in the resist composition of the invention may comprise additional recurring units other than the units of formulae (1) to (3), the polymers are represented by the following general formulae (4) and (5) provided that no additional recurring units are included.

Polymer I of general formula (4):

(4)

Herein $R^1$ and $R^2$ are each independently hydrogen or methyl, X is an electron withdrawing group, m is 0 or an integer of 1 to 4, n is an integer of 1 to 5, p and q are positive numbers satisfying p+q≤1.

Polymer II of general formula (5):

(5)

Herein $R^1$ and $R^2$ are each independently hydrogen or methyl, $R^3$ and $R^4$ are each independently hydrogen, optionally substituted hydroxyl, or halogen, X is an electron withdrawing group, m is 0 or an integer of 1 to 4, n is an integer of 1 to 5, u is 0 or an integer of 1 to 5, p, q and r are positive numbers satisfying p+q+r≤1.

It is noted that the meaning of p+q+r=1 is that in a polymer comprising recurring units p, q, and r, the sum of recurring units p, q and r is 100 mol % based on the total amount of entire recurring units. The meaning of p+q+r<1 is that the sum of recurring units p, q, and r is less than 100 mol % based on the total amount of entire recurring units, indicating the inclusion of other recurring units.

X stands for an electron withdrawing group. The electron withdrawing group which is bonded to the benzene ring is effective for reducing the electron density of the benzene ring. It may have either the inductive effect or the mesomeric effect. A mixture of two or more electron withdrawing groups is acceptable. The electron withdrawing group has an active structure directly bonded to the benzene ring, examples of which include a halogen atom exhibiting the inductive effect, and a carbonyl group, nitro group, cyano group, sulfinyl group, and sulfonyl group exhibiting the mesomeric effect. Of these active structures, the carbonyl, sulfinyl and sulfonyl groups are divalent and have the other end, examples of which include optionally substituted alkyl, aryl, alkoxy, and aryloxy groups of up to 15 carbon atoms.

Specifically, suitable electron withdrawing groups X include halogen atoms, nitro groups, nitrile groups, optionally substituted alkylcarbonyl groups of 1 to 15 carbon atoms, optionally substituted alkoxycarbonyl groups of 1 to 15 carbon atoms, optionally substituted arylcarbonyl groups of 7 to 20 carbon atoms, optionally substituted aryloxycarbonyl groups of 7 to 20 carbon atoms, optionally substituted alkylsulfinyl groups of 1 to 15 carbon atoms, optionally substituted alkoxysulfinyl groups of 1 to 15 carbon atoms, optionally substituted arylsulfinyl groups of 7 to 20 carbon atoms, optionally substituted aryloxysulfinyl groups of 7 to 20 carbon atoms, optionally substituted alkylsulfonyl groups of 1 to 15 carbon atoms, optionally substituted alkoxysulfonyl groups of 1 to 15 carbon atoms, optionally substituted arylsulfonyl groups of 7 to 20 carbon atoms, and optionally substituted aryloxysulfonyl groups of 7 to 20 carbon atoms. Each of the carbonyl (—CO—), sulfinyl (—SO—), and sulfonyl (—SO$_2$—) moieties in the foregoing groups is directly bonded to the benzene ring of styrene unit. Where the foregoing groups are substituted groups, exemplary substituent groups include halogen, alkoxy, alkyl- or aryl-carbonyl, alkyl- or aryl-carbonyloxy, and epoxy groups.

Among others, chlorine, bromine, iodine and alkoxycarbonyl groups of the general formula (6):

—CO—OR$^5$ (6)

wherein $R^5$ is an optionally substituted, straight, branched or cyclic alkyl group of 1 to 15 carbon atoms, are advantageous for the ease of synthesis and better characteristics. Exemplary straight, branched or cyclic alkyl groups represented by $R^5$ include methyl, ethyl, propyl, isopropyl, n-butyl, isobutyl, tert-butyl, cyclopentyl, cyclohexyl, norbornyl, and adamantyl. Where substituted, exemplary substituent groups include halogen, alkoxy, hydroxyl, and epoxy groups.

Of the electron withdrawing groups exemplified above, chlorine, bromine, and iodine are particularly effective in improving a pattern profile and inhibiting bridge formation.

Since the units of formula (3) are incorporated for the purpose of improving etch resistance as described above, $R^3$ and $R^4$ may or may not have an additional function. Examples of optionally substituted hydroxyl groups exemplified for $R^3$ and $R^4$ include hydroxyl, alkoxy groups of 1 to 15 carbon atoms, alkylcarbonyloxy groups of 2 to 15 carbon atoms, arylcarbonyloxy groups of 7 to 15 carbon atoms, alkylsulfonyloxy groups of 1 to 15 carbon atoms, and arylsulfonyloxy groups of 6 to 15 carbon atoms.

The compositional ratio (molar ratio) of constituent units in Polymer I is preferably selected in view of characteristics of resist material, such that p and q in formula (4) are positive numbers, and the compositional ratio of p satisfies $0.3 \leq p/(p+q) \leq 0.9$, and more preferably $0.5 \leq p/(p+q) \leq 0.8$. If the value of $p/(p+q)$ is too small, fine size patterns cannot be formed. If the value of $p/(p+q)$ is too large, there is an increased likelihood of pattern collapse due to swelling.

Besides the units of formula (3), Polymer I may have further incorporated therein recurring units which are commonly used in resist polymers (see JP-A 2006-201532). The acceptable compositional ratio of recurring units other than the units of formulae (1) to (3) is set to meet the following requirements. In one embodiment wherein the other recurring units are free of alkali-soluble groups, for example, alkyl-substituted styrene units and (meth)acrylate units as disclosed in the literature are used, the compositional ratio of recurring units of formula (1) is in a range of 30 to 90 mol %, and more preferably 50 to 80 mol % of the entire recurring units. To accomplish the advantages of the invention, the recurring units of formula (2) must be included in an amount of at least 3 mol %, and preferably at least 5 mol % relative to the entire recurring units. In another embodiment wherein the recurring units other than the units of formulae (1) to (3) have alkali-soluble groups, an empirical study of previously preparing model polymers having different molar ratios and determining a compositional ratio that affords an appropriate dissolution rate is necessary. In the other embodiment as well, to obtain an acid-catalyzed crosslinking reaction activity, the compositional ratio of recurring units of formula (1) is preferably in a range of at least 30 mol %, and more preferably at least 50 mol % of the entire recurring units. To accomplish the advantages of the invention, the recurring units of formula (2) must be included in an amount of at least 3 mol %, and preferably at least 5 mol % relative to the entire recurring units of the polymer.

As for Polymer II, p, q and r in formula (5) are positive numbers, the compositional ratio of p satisfies preferably $0.3 \leq p/(p+q+r) \leq 0.9$, and more preferably $0.6 \leq p/(p+q+r) \leq 0.8$, and the compositional ratio of r satisfies preferably $0 < r/(p+q+r) \leq 0.3$, and more preferably $0.05 \leq r/(p+q+r) \leq 0.3$. Notably the recurring units of formula (3) are incorporated for the main purpose of improving etch resistance. If the value of $r/(p+q+r)$ is too large, resolution is reduced. If the value of $r/(p+q+r)$ is too small, the effect of improving etch resistance is not exerted.

Likewise, recurring units other than the units of formulae (1) to (3) may be incorporated in Polymer II. A number of recurring units which can constitute polymers for use in resist compositions are known in the art as previously pointed out. The design procedure taken for incorporating recurring units other than the units of formulae (1) to (3) is essentially the same as in Polymer I. To accomplish the advantages of the invention, the recurring units of formula (2) must be included in an amount of at least 3 mol %, and preferably at least 5 mol % relative to the entire recurring units of the polymer.

The polymers should have a weight average molecular weight (Mw) of 1,000 to 50,000, preferably 2,000 to 8,000, as measured by gel permeation chromatography (GPC, HLC-8120GPC by Tosoh Corp.) versus polystyrene standards. With too low a Mw, the resist pattern is susceptible to thermal deformation. Too high a Mw increases the tendency for a bridging phenomenon to occur during pattern formation.

In a preferred embodiment, the polymer is obtained by removing a low molecular weight fraction from a polymer product as polymerized, so that the polymer has a dispersity Mw/Mn equal to or less than 1.7. Note that the dispersity is a weight average molecular weight divided by a number average molecular weight, Mw/Mn, and represents a molecular weight distribution. When a dispersity of 1.7 or less is achieved by removing the low molecular weight fraction, the resist pattern formed on a mask blank is improved in profile, the undercut problem is significantly ameliorated, and substantial resolution is improved.

For the synthesis of the polymers, one suitable method involves feeding acetoxystyrene monomer, a styrene monomer having an electron withdrawing group substituted thereon, and an optional indene or other monomer to an organic solvent, adding a radical initiator thereto, effecting thermal polymerization, subjecting the resulting polymer to alkaline hydrolysis in the organic solvent for deprotection of acetoxy groups, thus yielding a multi-component copolymer comprising hydroxystyrene and electron withdrawing group-substituted styrene. Suitable organic solvents used for polymerization include toluene, benzene, tetrahydrofuran, diethyl ether, and dioxane. Suitable polymerization initiators include 2,2'-azobisisobutyronitrile, 2,2'-azobis(2,4-dimethylvaleronitrile), dimethyl 2,2'-azobis(2-methyl propionate), benzoyl peroxide, and lauroyl peroxide. Preferably polymerization may be effected by heating at a temperature of 40° C. to 80° C. and for a time of 2 to 100 hours, and more preferably 5 to 40 hours. For the alkaline hydrolysis, exemplary bases are aqueous ammonia and triethylamine; the reaction temperature is −20° C. to 100° C., and preferably 0° C. to 60° C.; and the time is 0.2 to 100 hours, and preferably 0.5 to 40 hours.

The polymer product obtained by the abovementioned polymerization method may be adjusted to a dispersity of 1.7 or less by dissolving the polymer product in a good solvent, admitting the polymer solution into a bad solvent with stirring, and fractionating off the low molecular weight fraction in the bad solvent. Examples of the good and bad solvents used in this fractionation step include acetone, ethyl acetate, methyl acetate, propylene glycol monomethyl ether, propylene glycol monoethyl ether, propylene glycol methyl ether acetate, propylene glycol ethyl ether acetate, tetrahydrofuran, diethyl ether, water, methanol, ethanol, isopropanol, hexane, pentane, toluene, and benzene. Of these solvents, a choice may be made depending on whether the polymer subject to fractionation is lipophilic or hydrophilic. Other fractionation methods include precipitation of a polymer in a bad solvent, and separation into two layers of a good solvent (containing a polymer component to be collected) and a bad solvent (containing a low molecular weight fraction to be removed).

It is understood that the synthesis method is not limited to the foregoing.

Photoacid Generator

While the aforementioned polymer is compounded as a base resin in a chemically amplified negative resist composition, an acid generator which is decomposed to generate an acid upon exposure to high-energy radiation, referred to as "photoacid generator," may be compounded as well. It is noted that an acid generator which is sensitive to EB exposure is also referred to as "photoacid generator" in a sense to distinguish from a thermal acid generator capable of generating an acid by heat. A number of photoacid generators are known in the art including those described in JP-A 2006-201532 and JP-A 2006-215180 cited above. Generally, any of well-known photoacid generators may be used herein.

Suitable photoacid generators include sulfonium salts, iodonium salts, sulfonyldiazomethane and N-sulfonyloxyimide photoacid generators. Exemplary photoacid generators are given below while they may be used alone or in admixture of two or more.

Sulfonium salts are salts of sulfonium cations with sulfonate anions. Exemplary sulfonium cations include triphenylsulfonium, (4-tert-butoxyphenyl)diphenylsulfonium, bis(4-tert-butoxyphenyl)phenylsulfonium, tris(4-tert-butoxyphenyl)sulfonium, (3-tert-butoxyphenyl)diphenylsulfonium, bis(3-tert-butoxyphenyl)phenylsulfonium, tris(3-tert-butoxyphenyl)sulfonium, (3,4-di-tert-butoxyphenyl)diphenylsulfonium, bis(3,4-di-tert-butoxyphenyl)phenylsulfonium, tris(3,4-di-tert-butoxyphenyl)sulfonium, diphenyl(4-thiophenoxyphenyl)sulfonium, (4-tert-butoxycarbonylmethyloxyphenyl)diphenylsulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 2-naphthyldiphenylsulfonium, dimethyl-2-naphthylsulfonium, 4-hydroxyphenyldimethylsulfonium, 4-methoxyphenyldimethylsulfonium, trimethylsulfonium, 2-oxocyclohexylcyclohexylmethylsulfonium, trinaphthylsulfonium, and tribenzylsulfonium. Exemplary sulfonate anions include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, 4-(4-toluenesulfonyloxy)benzenesulfonate, naphthalenesulfonate, camphorsulfonate, octanesulfonate, dodecylbenzenesulfonate, butanesulfonate, and methanesulfonate. Sulfonium salts based on combination of the foregoing examples are included.

Iodinium salts are salts of iodonium cations with sulfonate anions. Exemplary iodonium cations are aryliodonium cations including diphenyliodinium, bis(4-tert-butylphenyl)iodonium, 4-tert-butoxyphenylphenyliodonium, and 4-methoxyphenylphenyliodonium. Exemplary sulfonate anions include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, 4-(4-toluenesulfonyloxy)benzenesulfonate, naphthalenesulfonate, camphorsulfonate, octanesulfonate, dodecylbenzenesulfonate, butanesulfonate, and methanesulfonate. Iodonium salts based on combination of the foregoing examples are included.

Exemplary sulfonyldiazomethane compounds include bis-sulfonyldiazomethane compounds and sulfonyl-carbonyldiazomethane compounds such as bis(ethylsulfonyl)diazomethane, bis(1-methylpropylsulfonyl)diazomethane, bis(2-methylpropylsulfonyl)diazomethane, bis(1,1-dimethylethylsulfonyl)diazomethane, bis(cyclohexylsulfonyl)diazomethane, bis(perfluoroisopropylsulfonyl)diazomethane, bis(phenylsulfonyl)diazomethane, bis(4-methylphenylsulfonyl)diazomethane, bis(2,4-dimethylphenylsulfonyl)diazomethane, bis(2-naphthylsulfonyl)diazomethane, 4-methylphenylsulfonylbenzoyldiazomethane, tert-butylcarbonyl-4-methylphenylsulfonyldiazomethane, 2-naphthylsulfonylbenzoyldiazomethane, 4-methylphenylsulfonyl-2-naphthoyldiazomethane, methylsulfonylbenzoyldiazomethane, and tert-butoxycarbonyl-4-methylphenylsulfonyldiazomethane.

N-sulfonyloxyimide photoacid generators include combinations of imide skeletons with sulfonate skeletons. Exemplary imide skeletons are succinimide, naphthalene dicarboxylic acid imide, phthalimide, cyclohexyldicarboxylic acid imide, 5-norbornene-2,3-dicarboxylic acid imide, and 7-oxabicyclo[2.2.1]-5-heptene-2,3-dicarboxylic acid imide. Exemplary sulfonate skeletons include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate.

Additionally, other photoacid generators as listed below are useful. Benzoinsulfonate photoacid generators include benzoin tosylate, benzoin mesylate, and benzoin butanesulfonate.

Pyrogallol trisulfonate photoacid generators include pyrogallol, fluoroglycine, catechol, resorcinol, hydroquinone, in which all the hydroxyl groups are substituted with sulfonate groups such as trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate.

Nitrobenzyl sulfonate photoacid generators include 2,4-dinitrobenzyl sulfonate, 2-nitrobenzyl sulfonate, and 2,6-dinitrobenzyl sulfonate, with exemplary sulfonates including trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate. Also useful are analogous nitrobenzyl sulfonate compounds in which the nitro group on the benzyl side is substituted with a trifluoromethyl group.

Sulfone photoacid generators include bis(phenylsulfonyl)methane, bis(4-methylphenylsulfonyl)methane, bis(2-naphthylsulfonyl)methane, 2,2-bis(phenylsulfonyl)propane, 2,2-bis(4-methylphenylsulfonyl)propane, 2,2-bis(2-naphthylsulfonyl)propane, 2-methyl-2-(p-toluenesulfonyl)propiophenone, 2-cyclohexylcarbonyl-2-(p-toluenesulfonyl)propane, and 2,4-dimethyl-2-(p-toluenesulfonyl)pentan-3-one.

Photoacid generators in the form of glyoxime derivatives include bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(p-toluenesulfonyl)-2-methyl-2,3-pentanedioneglyoxime, bis- O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(n-butanesulfonyl)-2,3-pentanedioneglyoxime, bis-O-(n-butanesulfonyl)-2-methyl-3,4-pentanedioneglyoxime, bis-O-(methanesulfonyl)-α-dimethylglyoxime, bis-O-(trifluoromethanesulfonyl)-α-dimethylglyoxime, bis-O-(1,1,1-trifluoroethanesulfonyl)-α-dimethylglyoxime, bis-O-(tert-butanesulfonyl)-α-dimethylglyoxime, bis-O-(perfluorooctanesulfonyl)-α-dimethylglyoxime, bis-O-(cyclohexylsulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-tert-butylbenzenesulfonyl)-α-dimethylglyoxime, bis-O-(xylenesulfonyl)-α-dimethylglyoxime, and bis-O-(camphorsulfonyl)-α-dimethylglyoxime.

Of these, sulfonium salt, bissulfonyldiazomethane and N-sulfonyloxyimide photoacid generators are preferred.

While the anion of an optimum acid generated varies depending on the reactivity of crosslinker in the resist composition, it is generally selected from those anions which are nonvolatile and not extremely diffusive. Suitable anions include benzenesulfonate, toluenesulfonate, 4-(4-toluenesulfonyloxy)benzenesulfonate, pentafluorobenzenesulfonate, 2,2,2-trifluoroethanesulfonate, nonafluorobutanesulfonate, heptadecafluorooctanesulfonate, and camphorsulfonate anions.

In the negative resist composition of the invention, the photoacid generator is preferably added in an amount of 0 to 30 parts by weight, more preferably 2 to 20 parts by weight per 100 parts by weight of the polymer or base resin. The photoacid generators may be used alone or in admixture of two or more. The transmittance of the resist film can be controlled by using a photoacid generator having a low transmittance at the exposure wavelength and adjusting the amount of the photoacid generator added.

Crosslinker

A crosslinker is an essential component in the chemically amplified negative resist composition. In some cases, the crosslinker can be incorporated in the polymer, for example, by adding epoxy group-bearing units to the units of formulae (1) to (3) during polymerization. Usually, crosslinking compounds as described below are separately added to the composition.

The crosslinker used herein may be any of crosslinkers which react with the polymer to induce intramolecular and intermolecular crosslinkage under the catalysis of the acid generated by the photoacid generator. Typically they are compounds having a plurality of functional groups which undergo electrophilic reaction with recurring units of formula (1) in the polymer to form bonds therewith. A number of such compounds are already known (see JP-A 2006-201532 and JP-A 2006-215180).

The crosslinker used in the resist composition may be any of well-known crosslinkers. Suitable crosslinkers include alkoxymethylglycolurils and alkoxymethylmelamines. Examples of suitable alkoxymethylglycolurils include tetramethoxymethylglycoluril, 1,3-bismethoxymethyl-4,5-bis-methoxyethylene urea, and bismethoxymethyl urea. Examples of suitable alkoxymethylmelamines include hexamethoxymethylmelamine and hexaethoxymethylmelamine.

In the negative resist composition of the invention, the crosslinker is preferably added in an amount of 2 to 40 parts by weight, more preferably 5 to 20 parts by weight per 100 parts by weight of the base resin. The crosslinkers may be used alone or in admixture of two or more. The transmittance of the resist film can be controlled by using a crosslinker having a low transmittance at the exposure wavelength and adjusting the amount of the crosslinker added.

Basic Compound

To the chemically amplified negative resist composition, a basic compound may be added as a component capable of controlling the diffusion distance of acid. Controlling the diffusion distance leads to better resolution, reduces the substrate and environment dependence, and improves the exposure latitude and pattern profile.

Examples of basic compounds include primary, secondary, and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, alcoholic nitrogen-containing compounds, amide derivatives, and imide derivatives.

Examples of suitable primary aliphatic amines include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine.

Examples of suitable secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dime thylethylamine, methylethylpropylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable nitrogen-containing compounds with carboxyl group include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable nitrogen-containing compounds with sulfonyl group include 3-pyridinesulfonic acid and pyridinium p-toluenesulfonate. Examples of suitable nitrogen-containing compounds with hydroxyl group, nitrogen-containing compounds with hydroxyphenyl group, and alcoholic nitrogen-containing compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl] piperazine, piperidine ethanol, 1-(2-hydroxyethyl) pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide.

Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

In addition, one or more of basic compounds of the following general formula (B)-1 may also be included.

$$N(Z)_n(Y)_{3-n} \quad \text{(B)-1}$$

In the formula, n is equal to 1, 2 or 3; Y is independently hydrogen or a straight, branched or cyclic alkyl group of 1 to 20 carbon atoms which may contain a hydroxyl group or ether group; and Z is independently selected from groups of the following general formulas (Z)-1 to (Z)-3, and two or three Z may bond together to form a ring.

(Z)-1

(Z)-2

(Z)-3

In the formulas, $R^{300}$, $R^{302}$ and $R^{305}$ are independently straight or branched $C_1$-$C_4$ alkylene groups; $R^{301}$ and $R^{304}$ are independently hydrogen or straight, branched or cyclic $C_1$-$C_{20}$ alkyl groups, which may contain at least one hydroxyl group, ether group, ester group or lactone ring; $R^{303}$ is a single bond or a straight or branched $C_1$-$C_4$ alkylene group; and $R^{306}$ is a straight, branched or cyclic $C_1$-$C_{20}$ alkyl group, which may contain at least one hydroxyl group, ether group, ester group or lactone ring.

Illustrative examples of the basic compounds of formula (B)-1 include, but are not limited to, tris[(2-methoxymethoxy)ethyl]amine, tris[2-(2-methoxyethoxy)ethyl] amine, tris[2-(2-methoxyethoxymethoxy)ethyl]amine, tris [2-(1-methoxyethoxy)ethyl]amine, tris[2-(1-ethoxyethoxy) ethyl]amine, tris[2-(1-ethoxypropoxy)ethyl]amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, 1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl)amine, tris[2-(2-oxopropoxy) ethyl]amine, tris[2-(methoxycarbonylmethyl)oxyethyl] amine, tris[2-(tert-butoxycarbonylmethyloxy)ethyl]amine, tris[2-(cyclohexyloxycarbonylmethyloxy)ethyl]amine, tris (2-methoxycarbonylethyl)amine, tris(2-ethoxycarbonylethyl)amine, N,N-bis(2-hydroxyethyl)-2-(methoxycarbonyl) ethylamine, N,N-bis(2-acetoxyethyl)-2-(methoxycarbonyl) ethylamine, N,N-bis(2-hydroxyethyl)-2-(ethoxycarbonyl) ethylamine, N,N-bis(2-acetoxyethyl)-2-(ethoxycarbonyl) ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl) ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]-ethylamine, N,N-bis(2-acetoxyethyl)-2-[(methoxycarbonyl)methoxycarbonyl]-ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl)-ethylamine, N,N-bis(2-acetoxyethyl)-2-(tetrahydrofurfuryloxycarbonyl)-ethylamine, N,N-bis(2-hydroxyethyl)-2-[(2-oxotetrahydrofuran-3-yl)oxycarbonyl] ethylamine, N,N-bis(2-acetoxyethyl)-2-[(2-oxotetrahydrofuran-3-yl)oxycarbonyl]ethylamine, N,N-bis (2-hydroxyethyl)-2-(4-hydroxybutoxycarbonyl)ethylamine, N,N-bis(2-formyloxyethyl)-2-(4-formyloxybutoxycarbonyl)-ethylamine, N,N-bis(2-formyloxyethyl)-2-(2-formyloxyethoxycarbonyl)-ethylamine, N,N-bis(2-methoxyethyl)-2-(methoxycarbonyl)ethylamine, N-(2- hydroxyethyl)-bis[2-(methoxycarbonyl)ethyl]amine, N-(2-acetoxyethyl)-bis[2-(methoxycarbonyl)ethyl]amine, N-(2-hydroxyethyl)-bis[2-(ethoxycarbonyl)ethyl]amine, N-(2-acetoxyethyl)-bis[2-(ethoxycarbonyl)ethyl]amine, N-(3-hydroxy-1-propyl)-bis[2-(methoxycarbonyl)ethyl]amine, N-(3-acetoxy-1-propyl)-bis[2-(methoxycarbonyl)ethyl]amine, N-(2-methoxyethyl)-bis[2-(methoxycarbonyl)ethyl]amine, N-butyl-bis[2-(methoxycarbonyl)ethyl]amine, N-butyl-bis[2-(2-methoxyethoxycarbonyl)ethyl]amine, N-methyl-bis(2-acetoxyethyl)amine, N-ethyl-bis(2-acetoxyethyl)amine, N-methyl-bis(2-pivaloyloxyethyl)amine, N-ethyl-bis[2-(methoxycarbonyloxy)ethyl]amine, N-ethyl-bis[2-(tert-butoxycarbonyloxy)ethyl]amine, tris(methoxycarbonylmethyl)amine, tris(ethoxycarbonylmethyl)amine, N-butyl-bis(methoxycarbonylmethyl)amine, N-hexyl-bis(methoxycarbonylmethyl)amine, and β-(diethylamino)-δ-valerolactone.

The basic compounds may be used alone or in admixture of two or more. The basic compound is preferably formulated in an amount of 0 to 2 parts, and especially 0.01 to 1 part by weight, per 100 parts by weight of the base resin in the resist composition. The use of more than 2 parts of the basis compound may result in too low a sensitivity.

Organic Solvent

In order that the negative resist composition be coated to form a resist film, the foregoing components are dissolved in an organic solvent to formulate the composition in solution form. A number of organic solvents are known and used to this end. Illustrative, non-limiting, examples of suitable organic solvents include butyl acetate, amyl acetate, cyclohexyl acetate, 3-methoxybutyl acetate, methyl ethyl ketone, methyl amyl ketone, cyclohexanone, cyclopentanone, 3-ethoxyethyl propionate, 3-ethoxymethyl propionate, 3-methoxymethyl propionate, methyl acetoacetate, ethyl acetoacetate, diacetone alcohol, methyl pyruvate, ethyl pyruvate, propylene glycol monomethyl ether, propylene glycol monoethyl ether, propylene glycol monomethyl ether propionate, propylene glycol monoethyl ether propionate, ethylene glycol monomethyl ether, ethylene glycol monoethyl ether, diethylene glycol monomethyl ether, diethylene glycol monoethyl ether, 3-methyl-3-methoxybutanol, N-methylpyrrolidone, dimethyl sulfoxide, γ-butyrolactone, propylene glycol alkyl ether acetates such as propylene glycol methyl ether acetate, propylene glycol ethyl ether acetate, and propylene glycol propyl ether acetate, alkyl lactates such as methyl lactate, ethyl lactate, and propyl lactate, and tetramethylene sulfone.

Of these, the propylene glycol alkyl ether acetates and alkyl lactates are especially preferred. The solvents may be used alone or in admixture of two or more. An exemplary useful solvent mixture is a mixture of propylene glycol alkyl ether acetates and/or alkyl lactates. It is noted that the alkyl groups of the propylene glycol alkyl ether acetates are preferably those of 1 to 4 carbon atoms, for example, methyl, ethyl and propyl, with methyl and ethyl being especially preferred. Since the propylene glycol alkyl ether acetates include 1,2- and 1,3-substituted ones, each includes three isomers depending on the combination of substituted positions, which may be used alone or in admixture. It is also noted that the alkyl groups of the alkyl lactates are preferably those of 1 to 4 carbon atoms, for example, methyl, ethyl and propyl, with methyl and ethyl being especially preferred.

When the propylene glycol alkyl ether acetate is used as the solvent, it preferably accounts for at least 50% by weight of the entire solvent. Also when the alkyl lactate or propylene glycol alkyl ether is used as the solvent, it preferably accounts for at least 50% by weight of the entire solvent. When a mixture of propylene glycol alkyl ether acetate and alkyl lactate or propylene glycol alkyl ether is used as the solvent, that mixture preferably accounts for at least 50% by weight of the entire solvent. In this solvent mixture, it is further preferred that the propylene glycol alkyl ether acetate is 5 to 40% by weight and the alkyl lactate or propylene glycol alkyl ether is 60 to 95% by weight. A lower proportion of the propylene glycol alkyl ether acetate would invite a problem of inefficient coating whereas a higher proportion thereof would provide insufficient dissolution and allow for particle and foreign matter formation. A lower proportion of the alkyl lactate or propylene glycol alkyl ether would provide insufficient dissolution and cause the problem of many particles and foreign matter whereas a higher proportion thereof would lead to a composition which has a too high viscosity to apply and loses storage stability.

In the negative resist composition, the solvent is preferably used in an amount of 300 to 2,000 parts by weight, especially 400 to 1,000 parts by weight per 100 parts by weight of the base resin. The concentration of the resulting composition is not limited thereto as long as a film can be formed by existing methods.

Surfactant

To the chemically amplified negative resist composition of the invention, a surfactant may be added for improving coating characteristics or the like.

Illustrative, non-limiting, examples of the surfactant include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenol ether and polyoxyethylene nonylphenol ether, polyoxyethylene polyoxypropylene block copolymers, sorbitan fatty acid esters such as sorbitan monolaurate, sorbitan monopalmitate, and sorbitan monostearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as EFTOP EF301, EF303 and EF352 (Tohkem Products Co., Ltd.), Megaface F171, F172 and F173 (Dainippon Ink & Chemicals, Inc.), Fluorad FC430 and FC431 (Sumitomo 3M Co., Ltd.), Asahiguard AG710, Surflon S-381, S-382, SC101, SC102, SC103, SC104, SC105, SC106, Surfynol E1004, KH-10, KH-20, KH-30 and KH-40 (Asahi Glass Co., Ltd.); organosiloxane polymers KP341, X-70-092 and X-70-093 (Shin-Etsu Chemical Co., Ltd.), acrylic acid or methacrylic acid Polyflow No. 75 and No. 95 (Kyoeisha Ushi Kagaku Kogyo K.K.). Inter alia, Fluorad FC430, Surflon S-381, Surfynol E1004, KH-20 and KH-30 are preferred. These surfactants may be used alone or in admixture.

In the chemically amplified negative resist composition of the invention, the surfactant is preferably formulated in an amount of up to 2 parts, and especially up to 1 part by weight, per 100 parts by weight of the base resin.

Process

A resist pattern is formed from the chemically amplified negative resist composition of the invention by any ordinary lithography process including coating step of the resist composition onto a processable substrate (or substrate to be processed), pattern-wise exposure step using high-energy radiation, and development step using an aqueous alkaline developer.

The material of which the processable substrate or its outermost surface layer is made is not particularly limited. In the case of semiconductor wafers, for example, silicon wafers may be used, and examples of the outermost surface layer include Si, $SiO_2$, SiN, SiON, TiN, WSi, BPSG, SOG, and organic antireflective films.

In another embodiment, a resist pattern is formed on a photomask blank, from which a photomask is obtained. Typical transparent substrates used herein include transparent substrates of quartz and calcium fluoride. In most cases, necessary functional films such as a light-shielding film, antireflective coating, phase shift film, and optionally, etch stop film and etch mask film are laid in sequence on the substrate, depending on the intended application. In some special cases, such a functional film is omitted. Examples of the material of which the functional film is made include silicon, or transition metals such as chromium, molybdenum, zirconium, tantalum, tungsten, titanium and niobium, which may be used to form a layer. Examples of the material of which the outermost surface layer is made include materials mainly containing silicon or silicon and oxygen and/or nitrogen, silicon compound materials mainly containing a transition metal in addition to the foregoing, and transition metal compound materials mainly containing a transition metal, specifically at least one of chromium, molybdenum, zirconium, tantalum, tungsten, titanium, and niobium, and optionally at least one of oxygen, nitrogen, and carbon.

Of these materials, the transition metal compound material tends to give rise to the undercut problem. Specifically, a photomask blank includes an outermost surface layer of a transition metal compound material, specifically a transition metal compound material containing oxygen and/or nitrogen, and more specifically a transition metal compound material containing chromium and oxygen and/or nitrogen. When a pattern is formed on this photomask blank using a chemically amplified negative resist composition, the pattern tends to be constricted near the substrate, resulting in a so-called "undercut" shape. Nevertheless, the chemically amplified negative resist composition of the invention is successful in ameliorating the undercut problem, as compared with prior art resist compositions. Thus the pattern forming process of the invention is advantageous.

The process starts with a coating step. In applying the inventive resist composition, any of well-known application techniques including spin coating, roll coating, flow coating, dip coating, spray coating, and doctor coating may be used. Spin coating is preferred for consistent formation of a thin coating.

The thickness of the coating is selected depending on the minimum line width of the desired pattern and the etching rate of the processable substrate. Usually a thickness which is equal to or greater than the minimum line width by a factor of 1 to 8 is selected.

The resist coating is then heated (i.e., prebaked) on a hot plate, heating furnace or the like for removing the unnecessary organic solvent remaining in the resist coating. The heating conditions, which vary with the type of substrate, may not be determined unequivocally. Where a hot plate is used, typical prebaking conditions include a temperature of 60 to 150° C. for about 1 to 10 minutes, preferably 80 to 120° C. for about 1 to 5 minutes.

The pattern exposure step is imagewise exposure in a well-known way using high-energy radiation providing a high transmittance to the benzene ring, for example, deep-UV having a wavelength equal to or more than 230 nm, typically KrF excimer laser radiation, EB, EUV, and X-ray. In the processing of a photomask blank, EB exposure is always used. For the EB exposure, an exposure dose of about 0.1 to 20 $\mu C/cm^2$ is preferred, with an exposure dose of about 3 to 10 $\mu C/cm^2$ being more preferred.

After the pattern exposure, the coated substrate is heated again (or post-exposure baked) for promoting acid-catalyzed crosslinking reaction. Where a hot plate is used, for example, the exposed areas of the coating are appropriately cured by heating at 60 to 150° C. for about 1 to 20 minutes, preferably at 80 to 120° C. for about 1 to 10 minutes.

In the subsequent development step, an aqueous alkaline developer is used to dissolving away the unexposed areas of the coating, leaving the desired resist pattern. Development is typically carried out in an aqueous solution of 0.1 to 5 wt %, preferably 2 to 3 wt % tetramethylammonium hydroxide (TMAH) for 0.1 to 3 minutes, preferably 0.5 to 2 minutes by a conventional technique such as dip, puddle or spray technique. In this way, a desired resist pattern is formed on the substrate.

EXAMPLE

Synthesis Examples, Comparative Synthesis Examples, Examples, and Comparative Examples are given below by way of illustration and not by way of limitation. The average molecular weights including weight average molecular weight (Mw) and number average molecular weight (Mn) are determined by gel permeation chromatography (GPC) versus polystyrene standards.

Synthesis Example 1

A 3-L flask was charged with 238.0 g of acetoxystyrene, 22.6 g of 4-chlorostyrene, 189.4 g of indene, and 675 g of toluene as a solvent. The reactor was cooled to −70° C. in a nitrogen blanket, followed by three repeated cycles of vacuum evacuation and nitrogen flow. The reactor was warmed to room temperature, fed with 40.5 g of 2,2'-azobis (2,4-dimethylvaleronitrile), V-65 (Wako Pure Chemical Industries, Ltd.) as a polymerization initiator, and heated at 45° C. whereupon reaction took place for 20 hours. The temperature was then raised to 55° C. whereupon reaction took place for a further 20 hours. The reaction solution was concentrated to a half volume and precipitated in 15.0 L of methanol. The resulting white solids were collected by filtration and dried in vacuum at 40° C., yielding 311 g of a white polymer.

The polymer was dissolved again in 488 g of methanol and 540 g of tetrahydrofuran, whereupon 162 g of triethylamine and 32 g of water were added to the polymer solution. Deprotection reaction occurred at 60° C. for 40 hours. Then for fractionation, the reaction solution was concentrated and dissolved in a solvent mixture of 548 g of methanol and 112 g of acetone. To this solution, 990 g of hexane was added dropwise over 10 minutes. The mixed white turbid solution was left at rest for separation, whereupon the lower (polymer) layer was taken out and concentrated. The polymer concentrate was dissolved again in a mixture of 548 g of methanol and 112 g of acetone, after which the solution was combined with 990 g of hexane for dispersion and separation. The lower (polymer) layer was taken out and concentrated. The concentrate was dissolved in 870 g of ethyl acetate, followed by one cycle of neutralization, separation and washing with a mixture of 250 g of water and 98 g of acetic acid, one cycle of separation and washing with 225 g of water and 75 g of pyridine, and four cycles of separation and washing with 225 g of water. Thereafter, the upper layer, ethyl acetate solution was concentrated, dissolved in 250 g of acetone, precipitated in 15 L of water, filtered, and vacuum dried at 50° C. for 40 hours, yielding 187 g of a white polymer.

The polymer, designated Poly-A, was analyzed by $^{13}$C-NMR, $^1$H-NMR and GPC, from which the composition and molecular weight were determined.
Copolymer Compositional Ratio (Molar Ratio)
hydroxystyrene/4-chlorostyrene/indene=76.0/6.5/17.5
Mw=4,200
Dispersity Mw/Mn=1.59

Synthesis Example 2

A 3-L flask was charged with 212.0 g of acetoxystyrene, 20.4 g of 4-bromostyrene, 188.1 g of indene, and 675 g of toluene as a solvent. The reactor was cooled to −70° C. in a nitrogen blanket, followed by three repeated cycles of vacuum evacuation and nitrogen flow. The reactor was warmed to room temperature, fed with 40.5 g of 2,2'-azobis(2,4-dimethylvaleronitrile), V-65 (Wako Pure Chemical Industries, Ltd.) as a polymerization initiator, and heated at 45° C. whereupon reaction took place for 20 hours. The temperature was then raised to 55° C. whereupon reaction took place for a further 20 hours. The reaction solution was concentrated to a half volume and precipitated in 15.0 L of methanol. The resulting white solids were collected by filtration and dried in vacuum at 40° C., yielding 320 g of a white polymer.

The polymer was dissolved again in 488 g of methanol and 540 g of tetrahydrofuran, whereupon 162 g of triethylamine and 32 g of water were added to the polymer solution. Deprotection reaction occurred at 60° C. for 40 hours. Then for fractionation, the reaction solution was concentrated and dissolved in a solvent mixture of 548 g of methanol and 112 g of acetone. To this solution, 990 g of hexane was added dropwise over 10 minutes. The mixed white turbid solution was left at rest for separation, whereupon the lower (polymer) layer was taken out and concentrated. The polymer concentrate was dissolved again in a mixture of 548 g of methanol and 112 g of acetone, after which the solution was combined with 990 g of hexane for dispersion and separation. The lower (polymer) layer was taken out and concentrated. The concentrate was dissolved in 870 g of ethyl acetate, followed by one cycle of neutralization, separation and washing with a mixture of 250 g of water and 98 g of acetic acid, one cycle of separation and washing with 225 g of water and 75 g of pyridine, and four cycles of separation and washing with 225 g of water. Thereafter, the upper layer, ethyl acetate solution was concentrated, dissolved in 250 g of acetone, precipitated in 15 L of water, filtered, and vacuum dried at 50° C. for 40 hours, yielding 191 g of a white polymer.

The polymer, designated Poly-B, was analyzed by $^{13}$C-NMR, $^1$H-NMR and GPC, from which the composition and molecular weight were determined.
Copolymer Compositional Ratio (Molar Ratio)
hydroxystyrene/4-bromostyrene/indene=77.7/5.4/16.9
Mw=4,100
Dispersity Mw/Mn=1.58

Synthesis Example 3

A 3-L flask was charged with 222.0 g of acetoxystyrene, 37.1 g of 4-methoxycarbonylstyrene, 178.3 g of indene, and 675 g of toluene as a solvent. The reactor was cooled to −70° C. in a nitrogen blanket, followed by three repeated cycles of vacuum evacuation and nitrogen flow. The reactor was warmed to room temperature, fed with 40.1 g of 2,2'-azobis(2,4-dimethylvaleronitrile), V-65 (Wako Pure Chemical Industries, Ltd.) as a polymerization initiator, and heated at 45° C. whereupon reaction took place for 20 hours. The temperature was then raised to 55° C. whereupon reaction took place for a further 20 hours. The reaction solution was concentrated to a half volume and precipitated in 15.0 L of methanol. The resulting white solids were collected by filtration and dried in vacuum at 40° C., yielding 299 g of a white polymer.

The polymer was dissolved again in 488 g of methanol and 540 g of tetrahydrofuran, whereupon 162 g of triethylamine and 32 g of water were added to the polymer solution. Deprotection reaction occurred at 60° C. for 40 hours. Then for fractionation, the reaction solution was concentrated and dissolved in a solvent mixture of 548 g of methanol and 112 g of acetone. To this solution, 990 g of hexane was added dropwise over 10 minutes. The mixed white turbid solution was left at rest for separation, whereupon the lower (polymer) layer was taken out and concentrated. The polymer concentrate was dissolved again in a mixture of 548 g of methanol and 112 g of acetone, after which the solution was combined with 990 g of hexane for dispersion and separation. The lower (polymer) layer was taken out and concentrated. The concentrate was dissolved in 870 g of ethyl acetate, followed by one cycle of neutralization, separation and washing with a mixture of 250 g of water and 98 g of acetic acid, one cycle of separation and washing with 225 g of water and 75 g of pyridine, and four cycles of separation and washing with 225 g of water. Thereafter, the upper layer, ethyl acetate solution was concentrated, dissolved in 250 g of acetone, precipitated in 15 L of water, filtered, and vacuum dried at 50° C. for 40 hours, yielding 165 g of a white polymer.

The polymer, designated Poly-C, was analyzed by $^{13}$C-NMR, $^1$H-NMR and GPC, from which the composition and molecular weight were determined.
Copolymer Compositional Ratio (Molar Ratio)
hydroxystyrene/4-methoxycarbonylstyrene/indene=74.9/10.0/15.1
Mw=4,700
Dispersity Mw/Mn=1.63

Synthesis Example 4

A 3-L flask was charged with 254.1 g of acetoxystyrene, 32.0 g of 4-t-butoxycarbonylstyrene, 163.8 g of indene, and 600 g of toluene as a solvent. The reactor was cooled to −70° C. in a nitrogen blanket, followed by three repeated cycles of vacuum evacuation and nitrogen flow. The reactor was warmed to room temperature, fed with 39.0 g of 2,2'-azobis(2,4-dimethylvaleronitrile), V-65 (Wako Pure Chemical Industries, Ltd.) as a polymerization initiator, and heated at 45° C. whereupon reaction took place for 20 hours. The temperature was then raised to 55° C. whereupon reaction took place for a further 20 hours. The reaction solution was concentrated to a half volume and precipitated in 15.0 L of methanol. The resulting white solids were collected by filtration and dried in vacuum at 40° C., yielding 318 g of a white polymer.

The polymer was dissolved again in 488 g of methanol and 540 g of tetrahydrofuran, whereupon 162 g of triethylamine and 32 g of water were added to the polymer solution. Deprotection reaction occurred at 60° C. for 40 hours. Then for fractionation, the reaction solution was concentrated and dissolved in a solvent mixture of 548 g of methanol and 112 g of acetone. To this solution, 990 g of hexane was added dropwise over 10 minutes. The mixed white turbid solution was left at rest for separation, whereupon the lower (polymer) layer was taken out and concentrated. The polymer concentrate was dissolved again in a mixture of 548 g of methanol and 112 g of acetone, after which the solution was combined with 990 g of hexane for dispersion and separation. The lower (polymer) layer was taken out and concentrated. The concentrate was dissolved in 870 g of ethyl acetate, followed by one cycle of neutralization, separation and washing with a mixture of 250 g of water and 98 g of acetic acid, one cycle of separation and washing with 225 g of water and 75 g of pyridine, and four cycles of separation and washing with 225 g of water. Thereafter, the upper layer, ethyl acetate solution was concentrated, dissolved in 250 g of acetone, precipitated in 15 L of water, filtered, and vacuum dried at 50° C. for 40 hours, yielding 178 g of a white polymer.

The polymer, designated Poly-D, was analyzed by $^{13}$C-NMR, $^{1}$H-NMR and GPC, from which the composition and molecular weight were determined.

Copolymer Compositional Ratio (Molar Ratio)
hydroxystyrene/4-t-butoxycarbonylstyrene/indene=77.8/7.0/15.1
Mw=5,000
Dispersity Mw/Mn=1.61

Synthesis Example 5

A 3-L flask was charged with 354.4 g of acetoxystyrene, 95.6 g of 4-chlorostyrene, and 1500 g of toluene as a solvent. The reactor was cooled to −70° C. in a nitrogen blanket, followed by three repeated cycles of vacuum evacuation and nitrogen flow. The reactor was warmed to room temperature, fed with 23.6 g of AIBN (Wako Pure Chemical Industries, Ltd.) as a polymerization initiator, and heated at 65° C. whereupon reaction took place for 40 hours. The reaction solution was concentrated to a half volume and precipitated in 20.0 L of methanol. The resulting white solids were collected by filtration and dried in vacuum at 40° C., yielding 420 g of a white polymer.

The polymer was dissolved again in 488 g of methanol and 540 g of tetrahydrofuran, whereupon 162 g of triethylamine and 32 g of water were added to the polymer solution. Deprotection reaction occurred at 60° C. for 40 hours. Then for fractionation, the reaction solution was concentrated and dissolved in a solvent mixture of 822 g of methanol and 168 g of acetone. To this solution, 1485 g of hexane was added dropwise over 10 minutes. The mixed white turbid solution was left at rest for separation, whereupon the lower (polymer) layer was taken out and concentrated.

The polymer concentrate was dissolved again in a mixture of 822 g of methanol and 168 g of acetone, after which the solution was combined with 1485 g of hexane for dispersion and separation. The lower (polymer) layer was taken out and concentrated. The concentrate was dissolved in 1300 g of ethyl acetate, followed by one cycle of neutralization, separation and washing with a mixture of 375 g of water and 98 g of acetic acid, one cycle of separation and washing with 375 g of water and 75 g of pyridine, and four cycles of separation and washing with 225 g of water. Thereafter, the upper layer, ethyl acetate solution was concentrated, dissolved in 375 g of acetone, precipitated in 20 L of water, filtered, and vacuum dried at 50° C. for 40 hours, yielding 280 g of a white polymer.

The polymer, designated Poly-E, was analyzed by $^{13}$C-NMR, $^{1}$H-NMR and GPC, from which the composition and molecular weight were determined.

Copolymer Compositional Ratio (Molar Ratio)
hydroxystyrene/4-chlorostyrene=75.8/24.2
Mw=5,200
Dispersity Mw/Mn=1.62

Synthesis Example 6

A 3-L flask was charged with 238.0 g of acetoxystyrene, 22.0 g of 4-chlorostyrene, 190.7 g of indene, and 675 g of toluene as a solvent. The reactor was cooled to −70° C. in a nitrogen blanket, followed by three repeated cycles of vacuum evacuation and nitrogen flow. The reactor was warmed to room temperature, fed with 40.5 g of 2,2'-azobis (2,4-dimethylvaleronitrile), V-65 (Wako Pure Chemical Industries, Ltd.) as a polymerization initiator, and heated at 45° C. whereupon reaction took place for 20 hours. The temperature was then raised to 55° C. whereupon reaction took place for a further 20 hours. The reaction solution was concentrated to a half volume and precipitated in 15.0 L of methanol. The resulting white solids were collected by filtration and dried in vacuum at 40° C., yielding 309 g of a white polymer.

The polymer was dissolved again in 488 g of methanol and 540 g of tetrahydrofuran, whereupon 162 g of triethylamine and 32 g of water were added to the polymer solution. Deprotection reaction occurred at 60° C. for 40 hours. The reaction solution was concentrated and dissolved in 870 g of ethyl acetate, followed by one cycle of neutralization, separation and washing with a mixture of 250 g of water and 98 g of acetic acid, one cycle of separation and washing with 225 g of water and 75 g of pyridine, and four cycles of separation and washing with 225 g of water. Thereafter, the upper layer, ethyl acetate solution was concentrated, dissolved in 250 g of acetone, precipitated in 15 L of water, filtered, and vacuum dried at 50° C. for 40 hours, yielding 220 g of a white polymer.

The polymer, designated Poly-F, was analyzed by $^{13}$C-NMR, $^{1}$H-NMR and GPC, from which the composition and molecular weight were determined.

Copolymer Compositional Ratio (Molar Ratio)
hydroxystyrene/4-chlorostyrene/indene=75.6/7.5/16.9
Mw=4,700
Dispersity Mw/Mn=1.88

Comparative Synthesis Example

Polymers, designated Poly-G, Poly-H, Poly-I, and Poly-J, were synthesized by the same procedure as in the foregoing Synthesis Examples.

Poly-G
Copolymer Compositional Ratio (Molar Ratio)
hydroxystyrene/indene=74.5/25.5
Mw=4,400
Dispersity Mw/Mn=1.60

Poly-H
Copolymer Compositional Ratio (Molar Ratio)
hydroxystyrene/4-isopropyloxystyrene/indene=73.9/11.6/14.5
Mw=4,100
Dispersity Mw/Mn=1.70

Poly-I
Copolymer Compositional Ratio (Molar Ratio)
hydroxystyrene/3,5-dimethoxystyrene/indene=70.8/15.6/13.6
Mw=4,300
Dispersity Mw/Mn=1.65

Poly-J
Copolymer Compositional Ratio (Molar Ratio)
hydroxystyrene/4-acetoxystyrene/indene=74.6/10.6/14.8
Mw=4,500
Dispersity Mw/Mn=1.65

The polymers synthesized are represented by the following formulae.

Examples 1 to 7 and Comparative Examples 1 to 4

Chemically amplified negative resist compositions were prepared in accordance with the formulation shown in Tables 1 and 2. The values in Tables are expressed in parts by weight (pbw). The components used in the resist compositions and shown in Tables 1 and 2 are identified below.

Crosslinker 1: tetramethoxymethylglycoluril
Crosslinker 2: hexamethoxymethylmelamine
PAG1: triphenylsulfonium 2,5-dimethylbenzene-sulfonate
PAG2: triphenylsulfonium 2,4,6-triisopropylbenzene-sulfonate
Basic compound: tris(2-methoxyethyl)amine
Surfactant A: KH-20 (Asahi Glass Co., Ltd.)
Solvent A: propylene glycol monomethyl ether acetate
Solvent B: ethyl lactate

TABLE 1

| (pbw) | Example | | | | | | |
|---|---|---|---|---|---|---|---|
| | 1 | 2 | 3 | 4 | 5 | 6 | 7 |
| Poly-A | 80 | | | | | | 80 |
| Poly-B | | 80 | | | | | |
| Poly-C | | | 80 | | | | |
| Poly-D | | | | 80 | | | |
| Poly-E | | | | | 80 | | |
| Poly-F | | | | | | 80 | |
| Crosslinker 1 | 8.2 | 8.2 | 8.2 | 8.2 | 8.2 | 6.4 | 8.2 |
| Crosslinker 2 | | | | | | 1.8 | |
| PAG1 | 8 | 8 | 8 | 8 | 8 | 8 | 8 |
| PAG2 | 2 | 2 | 2 | 2 | 2 | 2 | 2 |

TABLE 1-continued

| (pbw) | Example | | | | | | |
|---|---|---|---|---|---|---|---|
| | 1 | 2 | 3 | 4 | 5 | 6 | 7 |
| Basic compound | 0.4 | 0.4 | 0.4 | 0.4 | 0.33 | 0.33 | 0.33 |
| Solvent A | 320 | 320 | 320 | 320 | 320 | 320 | 320 |
| Solvent B | 760 | 760 | 760 | 760 | 760 | 760 | 760 |

TABLE 2

| (pbw) | Comparative Example | | | |
|---|---|---|---|---|
| | 1 | 2 | 3 | 4 |
| Poly-G | 80 | | | |
| Poly-H | | 80 | | |
| Poly-I | | | 80 | |
| Poly-J | | | | 80 |
| Crosslinker 1 | 8.2 | 8.2 | 8.2 | 8.2 |
| Crosslinker 2 | | | | |
| PAG1 | 8 | 8 | 8 | 8 |
| PAG2 | 2 | 2 | 2 | 2 |
| Basic compound | 0.4 | 0.4 | 0.4 | 0.4 |
| Solvent A | 320 | 320 | 320 | 320 |
| Solvent B | 760 | 760 | 760 | 760 |

The resist compositions was filtered through a 0.02-μm nylon resin filter and then spin-coated onto mask blanks having an outermost surface of chromium oxynitride to a thickness of 0.15 μm.

The mask blanks were then baked on a hot plate at 110° C. for 10 minutes. The resist films were exposed to electron beam using an EB exposure system HL-800D (Hitachi, High-Technologies Corp., accelerating voltage 50 keV), then baked (PEB) at 120° C. for 10 minutes, and developed with a solution of 2.38% tetramethylammonium hydroxide in water, thereby giving negative patterns.

The resulting resist patterns were evaluated as described below.

The optimum exposure dose (sensitivity Eop) was the exposure dose which provided a 1:1 resolution at the top and bottom of a 0.20-μm line-and-space pattern. The minimum line width (μm) of a line-and-space pattern which was ascertained separate on the mask blank without collapse when processed at the optimum dose was the resolution of a test resist. The shape in cross section of the resolved resist pattern was observed under a scanning electron microscope (SEM).

A cross section of the line-and-space resist pattern was also examined for bridge margin and undercut. The line width below which bridges resulting from dissolution residues of the resist (i.e., resist left undissolved in developer) are observed in spaces is reported as "bridge margin," with smaller values indicating better resolution in spaces.

The dry etch resistance of the resist composition following development was examined by dry etching a resist film using a system TE8500S (Tokyo Electron Ltd.) and observing a cross section of the resist film under SEM. A reduction in thickness of a resist film after etching is expressed by a relative value provided that a reduction in thickness of the resist film of Example 5 after etching is 1.0. Smaller values indicate resist films with better etch resistance.

The etching was effected under the following conditions.
Prees: 250 mJ
RF power: 800 W
Gas: CHF$_3$ 20 sccm+CF$_4$ 20 sccm+Ar 400 sccm
Etching time: 2'30"
The resist test results are shown in Table 3.

TABLE 3

| | | Eop (μC/cm$^2$) | Maximum resolution (μm) | Bridge margin (μm) | Dry etch resistance | Undercut |
|---|---|---|---|---|---|---|
| Example | 1 | 9.2 | 0.06 | 0.06 | 0.89 | slight |
| | 2 | 9.1 | 0.07 | 0.07 | 0.91 | slight |
| | 3 | 10.5 | 0.08 | 0.11 | 0.92 | slight |
| | 4 | 10.7 | 0.06 | 0.10 | 0.91 | slight |
| | 5 | 8.9 | 0.06 | 0.07 | 1 | slight |
| | 6 | 9.1 | 0.09 | 0.09 | 0.89 | small |
| | 7 | 8.7 | 0.05 | 0.06 | 0.9 | slight |
| Comparative Example | 1 | 11.3 | 0.11 | 0.12 | 0.87 | large |
| | 2 | 10.9 | 0.12 | 0.12 | 0.96 | large |
| | 3 | 9.9 | 0.14 | 0.14 | 0.98 | large |
| | 4 | 10.2 | 0.12 | 0.13 | 0.97 | large |

Figure 1:
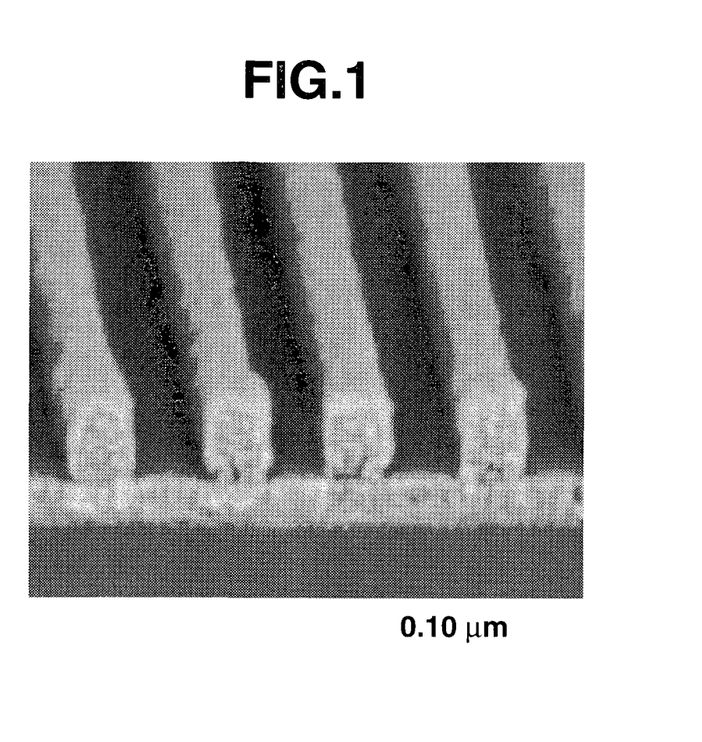
FIG. 1 is a photomicrograph of a resist pattern in Example 1.

FIG. 1 is a photomicrograph of the resist pattern (0.10-μm line-and-space pattern) obtained in Example 1. The side walls of lines are flat and no traces of bridges are found. Even though the resist is on the chromium compound which otherwise provides strong substrate dependence, only slight undercuts are seen.

Figure 2:
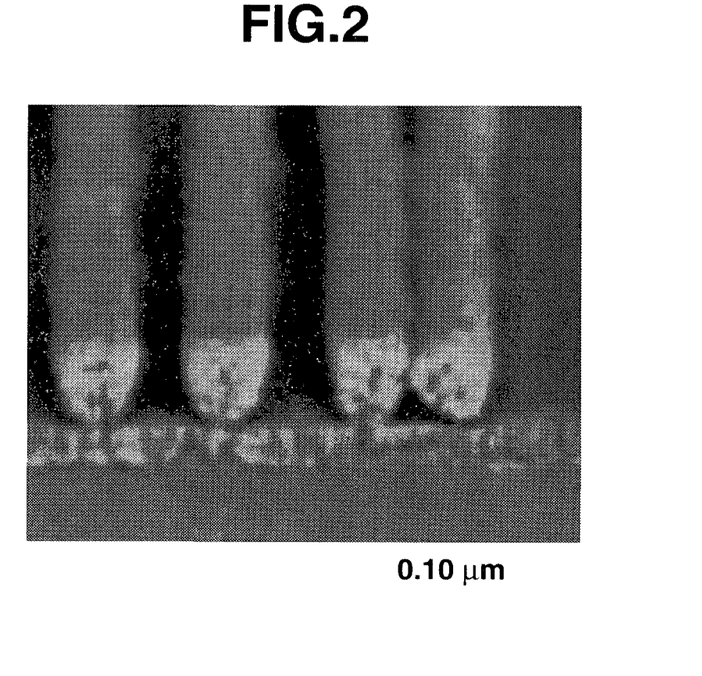
FIG. 2 is a photomicrograph of a resist pattern in Comparative Example 2.

FIG. 2 is a photomicrograph of the resist pattern (0.10-μm line-and-space pattern) obtained in Comparative Example 2. Some lines have fell down due to extreme undercuts, and some lines collapse following bridge formation, leaving small horn-like projections from lines.

It is seen from Table 3 and the photomicrograph of FIG. 1 that when a chemically amplified negative resist composition is prepared using a hydroxystyrene based polymer comprising electron withdrawing group-bearing styrene units represented by formula (2) as constituent units, applied as a resist coating, and processed to form a pattern, the pattern profile is significantly improved even though the resist pattern is on the chromium compound which is otherwise likely to invite pattern profile defectives near the substrate. Similarly the problem that bridges form between microscopic structures is also ameliorated.

In summary, the negative resist composition of the invention is defined as comprising as a base resin a polymer which is obtained by copolymerizing a monomer having a structure capable of converting to a functional group providing solubility through deprotection reaction, a styrene monomer having substituted thereon an electron withdrawing group, typically chlorine, bromine or iodine, and optionally a substituted or unsubstituted indene monomer, followed by deprotection reaction. The composition offers a high contrast of alkaline dissolution rate before and after exposure, forms a resist pattern of a satisfactory profile on a mask blank, especially a mask blank having an outermost surface of transition metal compound material, which indicates a high resolution, and exhibits satisfactory etch resistance. Accordingly, the composition is suited as a micro-patterning material for the fabrication of VLSI and a mask pattern-forming material.

Japanese Patent Application No. 2007-087243 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:
1. A resist pattern forming process comprising the steps of:
applying a chemically amplified negative resist composition onto a substrate having a surface composed of a chromium compound optionally containing oxygen and/or nitrogen to form a coating,
heating the coating,
exposing the coating to soft x-ray or electron beam,
post-exposure heating the coating, and
developing the coating with an aqueous alkaline solution, said chemically amplified negative resist composition consisting of:
100 parts by weight of a polymer comprising recurring units having the general formula (5):

wherein $R^1$ and $R^2$ are each independently hydrogen or methyl, $R^3$ and $R^4$ are each independently hydrogen, optionally substituted hydroxyl, or halogen, X is an electron withdrawing group selected from the group consisting of halogen atoms, m is 0 or an integer of 1 to 4, n is an integer of 1 to 5, u is 0 or an integer of 1 to 5, p, q and r are positive numbers satisfying $p+q+r<1$, said polymer having a weight average molecular weight of 1,000 to 50,000;
2 to 30 parts by weight of a photoacid generator;
2 to 40 parts by weight of a crosslinker which reacts with the polymer to induce intramolecular and intermolecular crosslinkage under the catalysis of an acid generated by the photoacid generator;
0 to 20 parts by weight of a basic compound;
300 to 2,000 parts by weight of an organic solvent; and
up to 1 part by weight of a surfactant,
wherein the crosslinker is selected from the group consisting of tetramethoxymethylglycoluril, 1,3-bis-methoxymethyl-4,5-bismethoxyethylene urea, bis-methoxymethyl urea, hexamethoxymethylmelamine, or hexaethoxymethylmelamine; and
the photoacid generator is selected from the group consisting of sulfonium salts, iodonium salts, sulfonyldiazomethane and N-sulfonyloxyimide photoacid generators, wherein a sulfonium cation of the sulfonium salts is selected from the group consisting of triphenylsulfonium, (4-tert-butoxyphenyl)diphenylsulfonium, bis(4-tert-butoxyphenyl)pheynylsulfonium, tris(4-tert-butoxyphenyl)sulfonium, (3-tert-butoxyphenyl)diphenylsulfonium, bis(3-tert-butoxyphenyl)phenylsulfonium, tris(3-tert-butoxyphenyl)sulfonium, (3,4-di-tert-butoxyphenyl)diphenylsulfonium, bis(3,4-di-tert-butoxyphenyl)phenylsulfonium, tris(3,4-di-tert-butoxyphenyl)sulfonium, diphenyl(4-thiophenoxyphenyl)sulfonium, (4-tert-butoxycarbonylmethyloxyphenyl)diphenylsulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 2-naphthyldiphenylsulfonium, dimethyl-2-naphthylsulfonium, 4-hydroxyphenyldimethylsulfonium, 4-methoxyphenyldimethylsulfonium, trimethylsulfonium, 2-oxocylcohexylcyclohexylmethylsulfonium, trinaphthylsulfonium, and tribenzylsulfonium, and an iodonium cation of the iodonium salts is selected from the group consisting of diphenyliodinium, bis(4-tert-butylphenyl)iodonium, 4-tert-butoxyphenylphenyliodonium, and 4-methoxyphenylphenyliodonium.

2. The process of claim 1 wherein the halogen atom represented by X is at least one member selected from the group consisting of chlorine, bromine, and iodine.

3. The process of claim 1 wherein the polymer has a weight average molecular weight of 2,000 to 8,000.

4. The process of claim 1 wherein the polymer has a dispersity Mw/Mn equal to or less than 1.7.

5. The process of claim 1, wherein the chromium compound contains oxygen and nitrogen.

6. The process of claim 1, wherein the chromium compound contains oxygen.

7. The process of claim 1, wherein the chromium compound contains nitrogen.

8. The process of claim 1, wherein p satisfies $0.3 \leq p/(p+q+r) \leq 0.9$ and r satisfies $0 < r/(p+q+r) \leq 0.3$.

* * * * *